(12) United States Patent
Lee et al.

(10) Patent No.: US 9,627,656 B2
(45) Date of Patent: Apr. 18, 2017

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jae-Man Lee, Yongin (KR); Seung-Joon Yoo, Yongin (KR); Hyun-Soo Choi, Yongin (KR); Jae-Wook Shin, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 378 days.

(21) Appl. No.: 13/847,988

(22) Filed: Mar. 20, 2013

(65) Prior Publication Data
US 2014/0183458 A1 Jul. 3, 2014

(30) Foreign Application Priority Data

Jan. 3, 2013 (KR) .......................... 10-2013-0000637

(51) Int. Cl.
| | | |
|---|---|---|
| *H01L 23/485* | (2006.01) | |
| *H01L 23/48* | (2006.01) | |
| *H05K 3/32* | (2006.01) | |
| *H05K 1/11* | (2006.01) | |
| *H01L 51/56* | (2006.01) | |
| *H01L 51/52* | (2006.01) | |
| *H01L 27/32* | (2006.01) | |

(52) U.S. Cl.
CPC .......... *H01L 51/56* (2013.01); *H01L 51/5246* (2013.01); *H01L 27/3244* (2013.01)

(58) Field of Classification Search
CPC .......... H01L 51/5203–51/5234; H01L 51/102–51/105; H01L 51/50–51/56; H01L 51/0032–51/0095; H01L 27/32–27/3297; H01L 51/5004; H01L 51/504–51/5044; H01L 51/5048–51/5084; H01L 51/5056–51/5068
USPC ...... 438/99; 257/40; 313/504, 506, 498, 512
See application file for complete search history.

(56) References Cited

U.S. PATENT DOCUMENTS

| | | | | |
|---|---|---|---|---|
| 6,313,541 | B1 * | 11/2001 | Chan ....................... | H01L 24/05 257/690 |
| 6,858,944 | B2 * | 2/2005 | Huang .................... | H01L 24/05 257/773 |
| 7,538,488 | B2 | 5/2009 | Kwak | |

(Continued)

FOREIGN PATENT DOCUMENTS

| | | |
|---|---|---|
| CN | 1658713 A | 8/2005 |
| EP | 1 814 185 A2 | 8/2007 |

(Continued)

*Primary Examiner* — Mary Wilczewski
*Assistant Examiner* — Tsz Chiu
(74) *Attorney, Agent, or Firm* — Knobbe, Martens, Olson & Bear, LLP (57) ABSTRACT

In an aspect, an organic light-emitting display apparatus is provided, including a display substrate; a sealing substrate configured to face the display substrate; a sealing material for bonding the display substrate and the sealing substrate and surrounding a circumference of the display unit; and a bonding layer comprising a plurality of through holes, wherein the plurality of through holes comprise partition walls therein.

15 Claims, 10 Drawing Sheets

(56) References Cited

U.S. PATENT DOCUMENTS

| | | | |
|---|---|---|---|
| 7,795,809 B2 * | 9/2010 | Ito | H01L 27/3246 257/79 |
| 7,816,788 B2 * | 10/2010 | Kasai | H01L 22/24 257/737 |
| 8,084,941 B2 | 12/2011 | Kim et al. | |
| 8,525,404 B2 * | 9/2013 | Jeon et al. | 313/506 |
| 8,778,726 B2 * | 7/2014 | Zu et al. | 438/99 |
| 2002/0182828 A1 * | 12/2002 | Asami et al. | 438/485 |
| 2003/0090615 A1 * | 5/2003 | Park | 349/153 |
| 2003/0137325 A1 * | 7/2003 | Yamazaki | H01L 27/322 327/80 |
| 2005/0168129 A1 * | 8/2005 | Chi | 313/495 |
| 2005/0184927 A1 * | 8/2005 | Kwak | 345/45 |
| 2006/0113875 A1 * | 6/2006 | Nakamura | 310/340 |
| 2007/0170845 A1 * | 7/2007 | Choi et al. | 313/504 |
| 2007/0170850 A1 * | 7/2007 | Choi et al. | 313/506 |
| 2007/0285007 A1 | 12/2007 | Lee et al. | |
| 2010/0117525 A1 * | 5/2010 | Warashina et al. | 313/504 |
| 2012/0321902 A1 | 12/2012 | Kohara et al. | |

FOREIGN PATENT DOCUMENTS

| | | |
|---|---|---|
| KR | 10-2005-0082260 A | 8/2005 |
| KR | 10-2009-0128430 A | 12/2009 |
| KR | 10-2010-0031313 A | 3/2012 |

* cited by examiner

ORGANIC LIGHT-EMITTING DISPLAY APPARATUS AND METHOD OF MANUFACTURING THE SAME

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2013-0000637, filed on Jan. 3, 2013 in the Korean Intellectual Property Office, the disclosure of which is incorporated herein in its entirety by reference.

BACKGROUND

Field

The present disclosure relates to an organic light-emitting display apparatus and a method of manufacturing the same, and more particularly, to an organic light-emitting display apparatus that employs a sealing unit having an enhanced bonding intensity and a method of manufacturing the same.

Description of the Related Technology

Generally, an organic light-emitting display apparatus is a self-emission display which is formed by using an organic light-emitting diode (OLED) which includes a hole-injected electrode, an electron-injected electrode, and an organic light-emitting display formed therebetween. The organic light-emitting display apparatus emits light when an exciton, generated when a hole injected from the hole-injected electrode and an electron injected from the electron-injected electrode are combined, drops from an excitation state to a ground state.

Since the organic light-emitting display apparatus which is a self-emission display does not need an additional power source, it may be driven with a low voltage, and may be formed of a light film. Additionally, the organic light-emitting display apparatus provides high-quality characteristics such as a wide viewing angle, high contrast, and a rapid response. Thus, an organic light-emitting display apparatus receives consideration as a next-generation display apparatus.

SUMMARY

The present disclosure provides an organic light-emitting display apparatus that employs a sealing unit having an enhanced bonding intensity and a method of manufacturing the same.

According to an aspect of the present disclosure, there is provided an organic light-emitting display apparatus, including: a display substrate in which a display unit including an organic light-emitting diode (OLED) and a thin-film transistor (TFT) is formed; a sealing substrate configured to face the substrate; a sealing material for bonding the display substrate and the sealing substrate and surrounding a circumference of the display unit; and a bonding layer including a plurality of through holes between the sealing material and the display substrate, wherein the plurality of through holes includes at least one of partition wall therein.

According to an aspect of the present disclosure, there is provided an organic light-emitting display apparatus, including: a display substrate; a sealing substrate configured to face the display substrate; a display unit located between the display substrate and sealing substrate, wherein said display unit comprises an organic light-emitting diode (OLED) and a thin-film transistor (TFT); a sealing material for bonding the display substrate and the sealing substrate and surrounding a circumference of the display unit; and a bonding layer comprising a plurality of through holes configured to allow contact between the sealing material and the display substrate, wherein each through holes comprises at least one partition wall therein.

In some embodiments, the bonding layer may include a light absorption layer.

In some embodiments, the light absorption layer may include a conductive material.

In some embodiments, the sealing material may be frit.

In some embodiments, a plurality of the partition walls may be included in the plurality of through holes and are formed to cross each other.

In some embodiments, a size of a width of each of the partition walls may be from 5% to 20% of a size of each of the plurality of through holes.

In some embodiments, side walls of the plurality of through holes may have stairs shapes.

In some embodiments, side walls of the plurality of through holes may be formed of insulation materials.

In some embodiments, the organic light-emitting display apparatus, further comprising an auxiliary layer, wherein the auxiliary layer and the TFT are sequentially stacked on the display substrate, wherein the TFT comprises an active layer, a gate insulating layer covering the active layer, a gate electrode insulted from the active layer by the gate insulating layer, an interlayer insulating layer covering the gate electrode, and a source electrode and a drain electrode that are formed on the interlayer insulating layer and contact the active layer, and wherein the bonding layer comprises a layer in which the interlayer insulating layer extends.

In some embodiments, an auxiliary layer and the TFT may be sequentially stacked on the display substrate, wherein the TFT includes an active layer, a gate insulating layer covering the active layer, a gate electrode insulted from the active layer by the gate insulating layer, an interlayer insulating layer covering the gate electrode, and a source electrode and a drain electrode that are formed on the interlayer insulating layer and contact the active layer, and wherein the bonding layer includes a layer in which the interlayer insulating layer extends.

In some embodiments, the bonding layer may have a structure in which a first insulation layer, a second insulation layer, and a third insulation layer are sequentially stacked, wherein the first insulation layer, the second insulation layer, and the third insulation layer are formed of the same materials of the auxiliary layer, the gate insulating layer, and the interlayer insulating layer, respectively.

In some embodiments, the bonding layer may include a light absorption layer, wherein the light absorption layer is formed of the same material as the gate electrode.

According to another aspect of the present disclosure, there is provided an organic light-emitting display apparatus including a display unit and a sealing unit surrounding the display unit, wherein the sealing unit includes: a display substrate; a bonding layer including a first insulation layer formed on the display substrate; a light absorption layer formed on the first insulation layer and formed of a conductive material, a second insulation layer covering the light absorption layer, and through holes including partition walls therein; and a sealing material bonded to the display substrate through the through holes.

According to another aspect of the present disclosure, there is provided an organic light-emitting display apparatus comprising a display unit and a sealing unit surrounding the display unit, wherein the sealing unit includes: a display substrate; a bonding layer; and a sealing material bonded to the display substrate through the through holes, wherein said bonding layer comprises a first insulation layer formed on the display substrate, a light absorption layer formed on the first insulation layer and formed of a conductive material, a second insulation layer covering the light absorption layer, and through holes comprising partition walls therein.

In some embodiments, the partition walls may be formed of insulating materials.

In some embodiments, the through holes may have rectangular shapes, and wherein a plurality of the partition walls are included in the through holes and cross each other.

In some embodiments, the display substrate and the sealing material may be formed of the same material.

According to another aspect of the present disclosure, there is provided a method of manufacturing an organic light-emitting display apparatus, the method including: preparing a display substrate partitioned by a first region and a second region surrounding the first region; sequentially forming an auxiliary layer, an active layer of a TFT, a gate insulating layer, a gate electrode, and an interlayer insulating layer in the first region; sequentially forming a first insulation layer, a second insulation layer, and a third insulation layer in the second region; and forming through holes that pass through the first insulation layer, the second insulation layer, and the third insulation layer and including partition walls therein.

In some embodiments, the sequentially forming of the first insulation layer, the second insulation layer, and the third insulation layer in the second region may include: forming a light absorption layer.

In some embodiments, the light absorption layer may be formed concurrently with the gate electrode.

In some embodiments, the auxiliary layer and the first insulation layer may be concurrently formed, wherein the gate insulating layer and the second insulation layer are concurrently formed.

In some embodiments, side walls of the through holes may have stairs shapes.

In some embodiments, a half-tone mask may be used to form the through holes.

In some embodiments, a plurality of the partition walls may be formed in the through holes.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION

The present disclosure will now be described more fully with reference to the accompanying drawings, in which exemplary embodiments are shown Like reference numerals in the drawings denote like elements, and thus their description will be omitted. In the drawings, the lengths and sizes of elements are exaggerated for clarity and convenience of description.

This disclosure may be embodied in many different forms and should not be construed as limited to the exemplary embodiments set forth herein. For example, it will be understood that when a layer is referred to as being "on" or "on the top of" another layer, the layer can be directly on another layer or intervening or layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated steps, operations, and/or elements, but do not preclude the presence or addition of one or more other steps, operations, and/or elements. It will be understood that, although the terms, 'first', 'second', etc. may be used herein to describe various elements, these elements should not be limited by these terms. These terms are only used to distinguish one element from another.

As used herein, the term "and/or" includes any and all combinations of one or more of the associated listed items. Expressions such as "at least one of," when preceding a list of elements, modify the entire list of elements and do not modify the individual elements of the list.

Figure 1A:
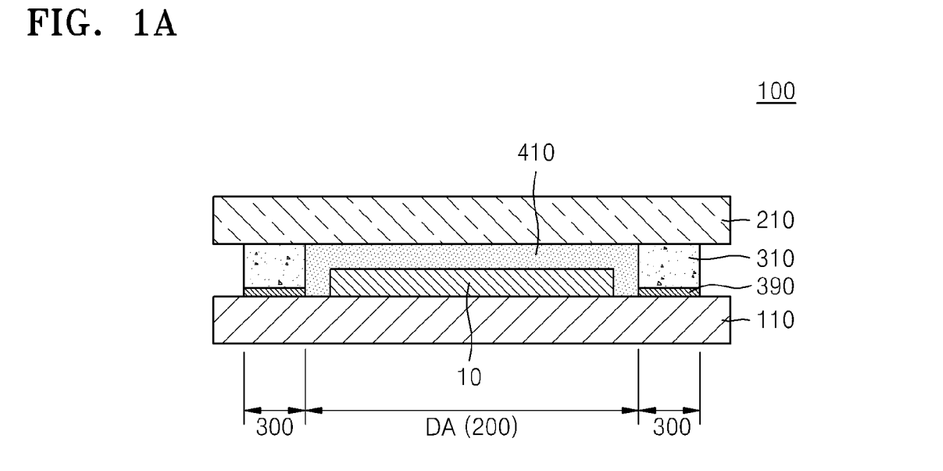
FIG. 1A is a cross-sectional view of an organic light-emitting display apparatus, according to an embodiment of the present disclosure.

FIG. 1A is a cross-sectional view of an organic light-emitting display apparatus 100, according to an embodiment of the present disclosure.

Figure 1B:
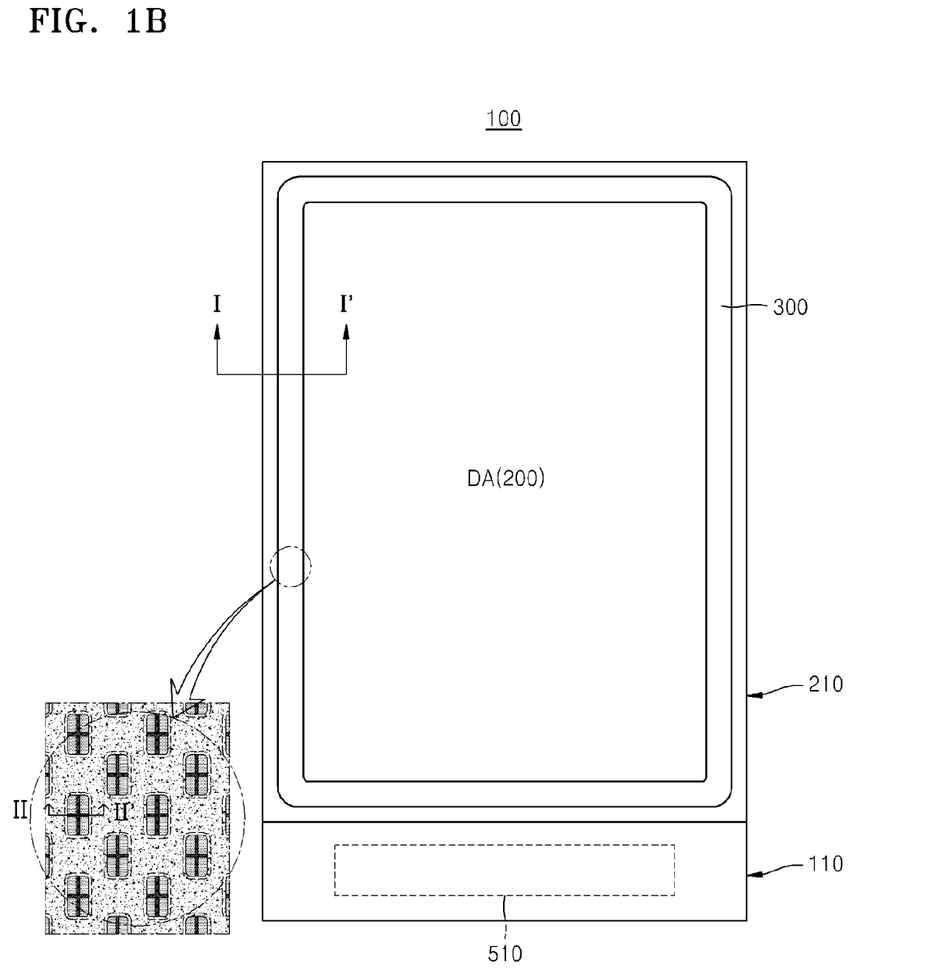
FIG. 1B is a schematic plan view of a structure of the organic light-emitting display apparatus of FIG. 1.

FIG. 1B is a schematic plan view of a structure of the organic light-emitting display apparatus 100 of FIG. 1.

Referring to FIGS. 1A and 1B, the organic light-emitting display apparatus 100 according to an embodiment of the present disclosure includes a display substrate 110, a display device 10 located on the display substrate 110, a sealing substrate 210 that covers the display substrate 110, and a sealing material 310 and a bonding layer 390 located between the display substrate 110 and the sealing substrate 210. An integrated circuit chip 510 may be mounted in one side edge of the display substrate 110 that is not covered by the sealing substrate 210.

The organic light-emitting display apparatus 100 includes a display unit DA 200 and a sealing unit 300. The display unit DA 200 is located between the display substrate 110 and the sealing substrate 210 that are surrounded by the sealing material 310. The sealing unit 300 is the location where the display substrate 110 and the sealing substrate 210 are adhered to each other by the sealing material 310 and the bonding layer 390.

In some embodiments, a display device 10 may be located on the display substrate 110 of the display unit DA 200, may be configured to include a thin film transistor (TFT), an organic light emitting diode (OLED) EL, and a storage element Cst, and may form an image by forming a plurality of pixels.

In some embodiments, the sealing substrate 210 functions as blocking the TFT and the organic light emitting element included in the display substrate 110 from external moisture, air, etc. In some embodiments, a polarizing film or a color filter may be located on the sealing substrate 210.

In some embodiments, an internal filling material 410 may be located between the display substrate 110 and the sealing substrate 210 of the display unit DA 200. In some embodiments, the internal filling material 410 may protect the display device 10 from a shock that may be applied from the outside. According to some embodiments, the internal filling material 410 may be formed of urethanes resin that is an organic sealant, epoxy based resin, acrylates resin, or silicon that is an inorganic sealant. For example, urethane acrylate may be used as the urethanes resin. For example, butyl acrylate, ethylhexyl acrylate, etc. may be used as the acrylates resin.

In some embodiments, the sealing unit 300 is the location where the display substrate 110 and the sealing substrate 210 are adhered to each other includes the sealing material 310 and the bonding layer 390. In some embodiments, the sealing unit 300 may function as preventing the display unit DA 200 from oxygen, moisture, etc. and enhancing a mechanical intensity by adhering the display substrate 110 and the sealing substrate 210 each other. A structure of the sealing unit 300 will be described later.

Figure 2A:
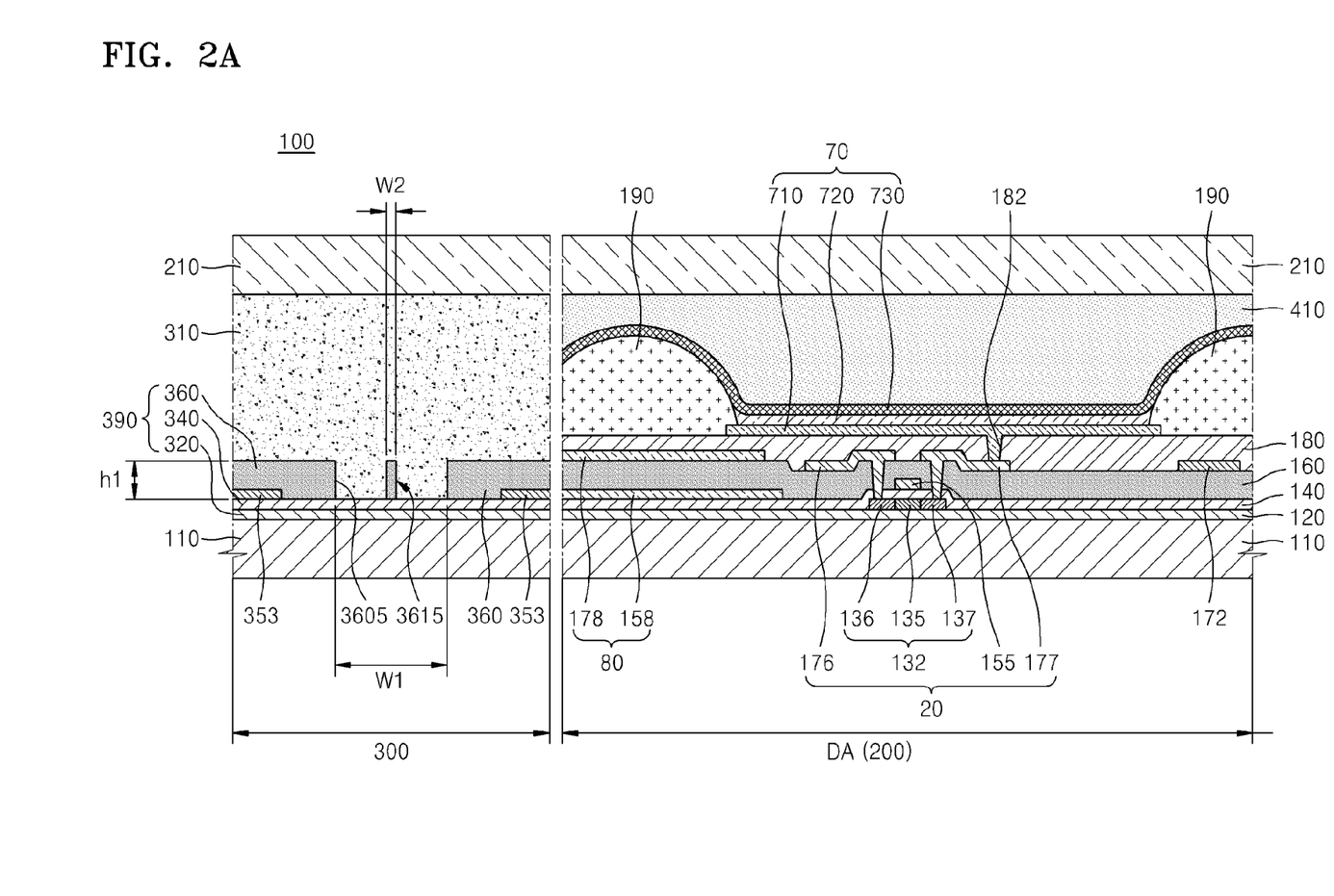
FIG. 2A is a cross-sectional view of the organic light-emitting display apparatus including a sealing unit taken along a line I-I' of FIG. 1B.

FIG. 2A is a cross-sectional view of the organic light-emitting display apparatus 100 including the sealing unit 300 taken along a line I-I' of FIG. 1B. FIG. 2A is a cross-sectional view of the sealing unit 300 taken along a line II-II' of FIG. 1B.

The display unit DA 200 includes a TFT 20, a storage element 80, and an OLED EL 70 including an organic light-emitting layer 720 on the display substrate 110 and/or an auxiliary layer 120.

In some embodiments, the display substrate 110 may be formed of transparent glass having silicon dioxide ($SiO_2$) as a main component. However, the display substrate 110 is not limited thereto, and may be formed of various materials such as ceramic, transparent plastic, metal, and the like.

In some embodiments, the auxiliary layer 120, such as a barrier layer, a blocking layer, and/or a buffer layer, may be located on the display substrate 110 to prevent spread of impurity ions, prevent inflow of moisture or external air, and planarize an upper surface of the display substrate 110. In some embodiments, the auxiliary layer 120 may be formed of silicon oxide, silicon nitride and/or silicon oxynitride by using various deposition methods such as plasma-enhanced chemical vapor deposition (PECVD), atmospheric pressure chemical vapor deposition (APCVD), low pressure CVD (LPCVD), and the like. In some embodiments, the silicon oxide may be $SiO_2$. In some embodiments, the silicon nitride may be $Si_3N_4$. In some embodiments, the silicon nitride may be $Si_xN_y$, wherein x and y are natural numbers of 1 to 20, respectively. In some embodiments, the silicon oxynitride may be $SiO_xN_y$, wherein x and y are natural numbers of 1 to 20, respectively. In some embodiments, the auxiliary layer 120 is not necessarily crucial, and may be omitted according to circumstances.

In some embodiments, the TFT 20 may include an active layer 132, a gate electrode 155, and source/drain electrodes 176 and 177. A gate insulating member 140 is interposed between the gate electrode 155 and the active layer 132 to insulate the gate electrode 155 from the active layer 132. In some embodiments, the active layer 132 may be formed of an inorganic semiconductor such as amorphous silicon or poly silicon, or an organic semiconductor. In some embodiments, the active layer 132 may be formed of an oxide semiconductor. For example, the oxide semiconductor may include an oxide of at least one material selected from metal elements in groups 12 through 14 consisting of zinc (Zn), indium (In), gallium (Ga), stannum (Sn), Cadmium (Cd), Germanium (Ge), and hafnium (Hf), and a combination thereof.

In some embodiments, source/drain areas 136 and 137 may be formed at both edges of the active layer 132. In some embodiments, the source/drain areas 136 and 137 may be connected to the source/drain electrodes 176 and 177, respectively.

In some embodiments, the gate electrode 155 is formed on the gate insulating member 140, and an interlayer insulating member 160 is formed to cover the gate electrode 155 and the gate insulating member 140. Data wires 176 and 177 including the source electrode 176 and the drain electrode 177 may be formed on the interlayer insulating member 160. In some embodiments, the data wire may further include a common power line 172, a second storage plate 178, and other wires.

In some embodiments, the gate insulating member 140 and the interlayer insulating member 160 may be formed of an insulating material. For example, the gate insulating member 140 and the interlayer insulating member 160 may also be formed in a stacked structure of single or multiple layers which includes an inorganic material, an organic material, or a combination thereof, by using various deposition methods. In some embodiments, the gate insulating member 140 and the interlayer insulating member 160 may be formed of silicon nitride or silicon oxide. In some embodiments, the silicon oxide may be $SiO_2$. In some embodiments, the silicon nitride may be $Si_3N_4$. In some embodiments, the silicon nitride may be $Si_xN_y$, wherein x and y are natural numbers of 1 to 20, respectively.

The stacked structure of the TFT is only an example, and various structures may be used for the TFT.

In some embodiments, a planarization layer 180 may be located on the interlayer insulating member 160 to cover the data wires 172, 176, 177, and 178. In some embodiments, the planarization layer 180 may function as removing a phase difference and planarize the OLED EL 70 so as to increase emission efficiency. In some embodiments, the planarization layer 180 includes a contact hole 182 to expose a part of the drain electrode 177.

In some embodiments, the planarization layer 180 may be formed of an insulating material. For example, the planarization layer 180 may also be formed in a stacked structure of single or multiple layers which includes an inorganic material, an organic material, or a combination thereof, by using various deposition methods. In some embodiments, the planarization layer 180 may be formed of one or more materials selected from the group consisting of polyacrylates resin, epoxy resin, phenolic resin, polyamides resin, polyimides rein, unsaturated polyesters resin, poly phenylenethers resin, poly phenylenesulfides resin, and benzocyclobutene (BCB).

The present embodiment is not limited to the above-described structure, and the planarization layer 180 or the interlayer insulating member 160 may be omitted according to circumstances.

In some embodiments, the storage element 80 may include a first storage plate 158 and the second storage plate 178 having the gate insulating member 140 therebetween. A storage capacity is determined according to charges stored in the storage element 80 and a voltage between the first storage plate 158 and the second storage plate 178.

In some embodiments, the OLED EL 70 includes an anode electrode 710 connected to one of the source/drain electrodes 176 and 177 of the TFT 20, a cathode electrode 730 formed to face the anode electrode 710, and the organic light-emitting layer 720 interposed therebetween.

In some embodiments, the anode electrode 710 of the OLED EL 70 may be formed on the planarization layer 180, and a pixel-defining layer 190 is formed to cover the anode electrode 710 and the planarization layer 180. In some embodiments, the pixel-defining layer 190 may be formed by using resin, such as polyacrylates or polyimides, or a silica-based inorganic material. In some embodiments, a predetermined opening is formed on the pixel-defining layer 190, and the organic light-emitting layer 720 of the OLED EL 70 may be formed in an area limited to the opening. Then, the cathode electrode 730 of the OLED EL 70 may be formed to cover all the electrodes. In some embodiments, the anode electrode 710 and the cathode electrode 730 may be exchanged with each other.

In some embodiments, the anode electrode 710 may be formed of a transparent electrode or a reflective electrode. If formed of a transparent electrode, the anode electrode 710 may include ITO, IZO, ZnO, or $In_2O_3$. Otherwise, if formed of a reflective electrode, the anode electrode 21 may include a reflective layer, formed of Ag, Mg, Al, Pt, Pd, Au, Ni, Nd, Ir, Cr, or a compound thereof, and a transparent layer, formed of ITO, IZO, ZnO, or $In_2O_3$. In some embodiments, the anode electrode 710 may be formed of a reflective electrode with a structure of ITO/Ag/ITO.

In some embodiments, the cathode electrode 730 may also be formed of a transparent electrode or a reflective electrode. If formed of a transparent electrode, the cathode electrode 730 may include a layer formed to face the organic light-emitting layer 720 by depositing Li, Ca, LiF/Ca, LiF/Al, Al, Mg, or a compound thereof, and an auxiliary electrode or a bus electrode line formed of a transparent conductive material such as ITO, IZO, ZnO, or $In_2O_3$ on the layer. If formed of a reflective electrode, the cathode electrode 730 may be formed of Li, Ca, LiF/Ca, LiF/Al, Al, Mg, or a compound thereof.

In some embodiments, a low-molecular weight organic material or a polymer organic material may be employed as the organic light-emitting layer 720 which is located between the anode electrode 710 and the cathode electrode 730. When the organic light-emitting layer 720 is formed of a low-molecular weight organic material, a hole injection layer (HIL), a hole transport layer (HTL), an electron transport layer (ETL), or an electron injection layer (EIL), which are not illustrated, may be stacked to form a single or multiple structure, having the organic light-emitting layer 720 therebetween. Various organic materials, such as a copper phthalocyanine (CuPc), a N,N'-Di(naphthalene-1-yl)-N,N'-diphenyl-benzidine (NPB), or a tris-8-hydroxyquinoline aluminum (Alq3), may be used to form the organic light-emitting layer 720. In some embodiments, the low-molecular weight organic material may be formed on the masks by using a vacuum deposition method.

When the organic light-emitting layer 720 is formed of a polymer organic material, the HTL (not illustrated) may be further included between the organic light-emitting layer 720 and the anode electrode 710. In some embodiments, the HTL may be formed of poly(3,4-ethylenedioxythiophene) (PEDOT) and the organic light-emitting layer 720 may be formed of a polymer organic material such as PPV (polyphenylenevinylene) or polyfluorene.

In some embodiments, the organic light-emitting layer 720 may include a unit pixel which is formed of sub-pixels that respectively emit red, green, or blue lights.

Although the organic light-emitting layer 720 of FIG. 2A may be located in the opening of the pixel-defining layer 190, an embodiment of the present disclosure is not limited thereto. For example, the organic light-emitting layer 720 may be formed on the anode electrode 710 in the opening of the pixel-defining layer 190 as well as may be located between the pixel-defining layer 190 and the cathode electrode 730.

According to the above-described embodiment, as an example, the organic light-emitting is formed on the opening, and separate light-emitting materials are formed for each pixel. However, the present disclosure is not limited thereto. In some embodiments, the organic light-emitting layer 720 may also be formed on the entire planarization layer 180, regardless of a location of pixels. In some embodiments, the organic light-emitting layer 720 may be formed, for example, by vertically stacking or mixing layers which include light-emitting materials emitting red, green, and blue lights. If the organic light-emitting layer is capable of emit a white light, different colors may also be combined. Additionally, a color conversion layer for converting the emitted white light into a predetermined color, or a color filter may be further included.

In some embodiments, the sealing unit 300, which is the location which the display substrate 110 and the sealing substrate 210 are adhered to each other, includes the sealing material 310 and the bonding layer 390.

In some embodiments, the sealing material 310 and the bonding layer 390 may be configured to surround the display unit DA 200 of the display substrate 110. In some embodiments, the sealing material 310 may be an inorganic substance, for example, frit. However, the present disclosure is not limited thereto, and the sealing material 310 may be epoxy.

In some embodiments, the sealing material 310 may be formed by using a dispenser or a screen printing method. Although frit generally means a powder type glass material, the present disclosure includes frit including a main component such as $SiO_2$ and a laser or infrared absorption material, an organic binder, a filler for reducing a thermal expansion coefficient, etc. in a paste state. In some embodiments, the frit in the paste state may be hardened by removing the organic binder and moisture through a dry or sintering process. In some embodiments, the laser or infrared absorption material may include a transition metal compound. In some embodiments, a laser light may be used as a thermal source for hardening the sealing material 310 and adhering the display substrate 110 and the sealing substrate 210 to each other.

In some embodiments, the bonding layer 390 may be used to enhance a bonding force between the display substrate 110 and the sealing material 310 and may include a plurality of through holes 3605 including partition walls 3615 therein. In some embodiments, the bonding layer 390 may further include a light absorption layer 353 that adsorbs the laser light and assists in hardening the sealing material 310.

Typically, the mechanical intensity of the organic light emitting display apparatus 100 depends on the bonding force between the sealing material 310, the display substrate 110, and the sealing substrate 210. If the bonding force is weak, the display substrate 110 and the sealing substrate 210 may be easily separated from each other by an external shock.

In some embodiments, the bonding layer 390 has a structure in which the sealing material 310 and the display substrate 110 are coupled to each other in a stereoscopic manner and may inhibit such a separation due to the external shock. That is, the bonding layer 390 includes the through holes 3605 which include the partition walls 3615 standing vertically with respect to the display substrate 110.

In some embodiments, the bonding layer 390 may include a monolayer insulation layer or a multilayer insulation layer. Referring to FIG. 2A, the bonding layer 390 may include a first insulation layer 320, a second insulation layer 340, and a third insulation layer 360. In some embodiments, the first insulation layer 320 may be formed of the same material as the auxiliary layer 120. In some embodiments, the second insulation layer 340 may be formed of the same material as the gate insulating layer 140. However, the present disclosure is not limited thereto. In some embodiments, the insulation layers included in the bonding layer 390 may be formed separately from the insulation layer included in the display unit DA 200.

In some embodiments, the through holes 3605 may be formed to pass through only the third insulation layer 360 or may be formed to pass through the second insulation layer 340 and the third insulation layer 360. In some embodiments, the through holes 3605 may be formed to pass through the third insulation layer 360, the second insulation layer 340, and the first insulation layer 320. In some embodiments, the through holes 3605 may be formed in various shapes. For example, the through holes 3605 may be formed in circular, oval, polygonal, or asymmetrical shapes. In some embodiments, a width W1 of each of the through holes 3605 may be several tens μm. In some embodiments, the width W1 of each of the through holes 3605 may be from about 10 to about 100 μm. In some embodiments, the width W1 of each of the through holes 3605 may be from about 20 to about 60 μm. In some embodiments, a height h1 of each of the through holes 3605 may be several μm. In some embodiments, a height h1 of each of the through holes 3605 may be from about 1 to about 10 μm. In some embodiments, a height h1 of each of the through holes 3605 may be from about 2 to about 6 μm.

In some embodiments, the partition walls 3615 may include a monolayer insulation layer or a multilayer insulation layer. In some embodiments, the partition walls 3615 may not include the light absorption layer 353 that will be described later. In some embodiments, a plurality of the partition walls 3615 may be formed in the through holes 3605. Also, the plurality of the partition walls 3615 may be formed to cross each other. In some embodiments, a width W2 of each of the partition walls 3615 may be several μm. In some embodiments, the width W2 of each of the partition walls 3615 may be from about 1 to about 10 μm. In some embodiments, the width W2 of the partition walls 3615 may be from about 2 to about 6 μm. In some embodiments, the width W2 of each of the partition walls 3615 may be approximately from 5% to 20% of the width W1 of each of the through holes 3605.

In some embodiments, the light absorption layer 353 may function as absorbing the laser light for hardening the sealing material 310. Referring to FIG. 2A, the light absorption layer 353 is formed between the second insulation layer 340 and the third insulation layer 360 but the present disclosure is not limited thereto. In some embodiments, the light absorption layer 353 may be located in the middle of the first insulation layer 320, the second insulation layer 340, and the third insulation layer 360. In some embodiments, the light absorption layer 353 may be located in a lower portion of the first insulation layer 320. In some embodiments, the light absorption layer 353 may be formed of a conductive material. For example, the light absorption layer 353 may be formed of a material such as Mo, W, Cu, Au, and Al. In some embodiments, the light absorption layer 353 may function as various conducting lines connected to drive an element 10 (see FIG. 1A) of the display unit DA 200. In some embodiments, the light absorption layer 353 may be formed of the same material as the first storage plate 158 or the gate electrode 155 of the display unit DA 200. In some embodiments, the light absorption layer 353 may be patterned so as not to directly contact the sealing material 310. This may be designed in consideration of an interface bonding force between the light absorption layer 353 and the sealing material 310.

In some embodiments, the first insulation layer 320, the second insulation layer 340, the light absorption layer 353, and/or the third insulation layer 360 may be sequentially deposited on the display substrate 110 to form a structure of the bonding layer 390. In some embodiments, the light absorption layer 353 may be patterned according to circumstances.

In some embodiments, the first insulation layer 320, the second insulation layer 340, the light absorption layer 353, and the third insulation layer 360 may be formed by using various methods known as general thin film growing methods. For example, an epitaxial deposition method, metal organic chemical vapor deposition (MOCVD), hydride vapor phase epitaxy (HVPE), molecular beam epitaxy (MBE), metal organic vapor phase epitaxy (MOVPE), halide chemical vapor deposition, sputtering, atomic layer deposition (ALD), and plasma enhanced CVD (PECVD) may be used.

In some embodiments, the first insulation layer 320 may be formed concurrently with the auxiliary layer 120 of the display unit DA 200, and the second insulation layer 340 may be formed concurrently with the gate insulating layer 140. Also, the third insulation layer 360 may be formed concurrently with the interlayer insulating layer 160. In some embodiments, the light absorption layer 353 may be formed concurrently with the gate electrode 155 and/or the first storage plate 158.

Thereafter, the through holes 3605 including the partition walls 3615 may be formed by partially etching the stacked structure including the first insulation layer 320, the second insulation layer 340, the light absorption layer 353, and/or the third insulation layer 360. In some embodiments, to form the through holes 3605, a process of forming a plurality of photoresist (PR) patterns on the stacked structure by using a photolithography process, and then etching the stacked structure by using the plurality of PR patterns as etching masks. In some embodiments, the etching process may use a dry etching process, a wet etching process, or an etching process in combination of the dry and wet etching processes.

In some embodiments, the sealing material 310 directly contacts an upper portion of the second insulation layer 340 through the through holes 3605 of the bonding layer 390. Although the through holes 3605 may be formed to pass through only the third insulation layer 360 in FIG. 2A, the present disclosure is not limited thereto. In some embodiments, the through holes 3605 may contact the display substrate 110 and an upper portion of the first insulation layer 320 or the second insulation layer 340. Also, the sealing material 310 contacts side walls of the through holes 3605, covers the partition walls 3615, and directly contacts and is adhered to side surfaces and upper portions of the partition walls 3615. In some embodiments, the sealing material 310 may be thermally hardened by the laser light.

Figure 2B:
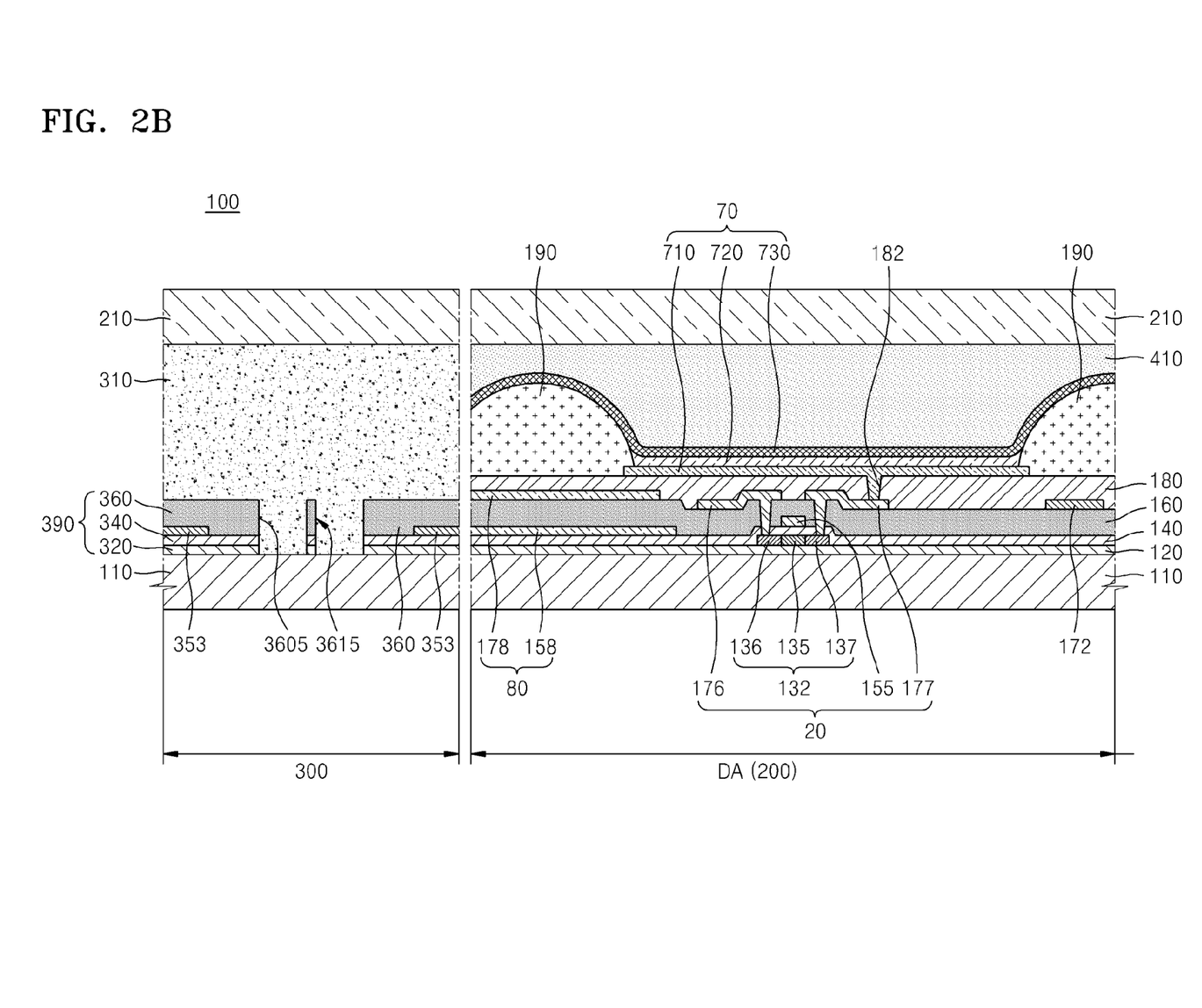
FIG. 2B is a cross-sectional view of an organic light-emitting display apparatus including a sealing unit, according to another embodiment of the present disclosure.

FIG. 2B is a cross-sectional view of the organic light-emitting display apparatus 100 including the sealing unit 300, according to another embodiment of the present disclosure. In FIG. 2B, like reference numerals as shown in FIG. 2A denote like elements, and thus their description will not be provided here.

Referring to FIG. 2B, the through holes 3605 of the bonding layer 390 may be formed to pass through the first insulation layer 320, the second insulation layer 340, and the third insulation layer 360. Thus, the sealing material 310 may directly contact an upper portion of the display substrate 110. In some embodiments, the sealing material 310 and the display substrate 110 may be formed of glass materials. For example, the sealing material 310 may be formed of frit, and the display substrate 110 may be formed of a glass material. Also, in another embodiment, the sealing material 310 and the display substrate 110 may be formed of ceramic materials.

In some embodiments, the sealing material 310 directly contacts the upper portion of the display substrate 110 through the through holes 3605 of the bonding layer 390. In a case where the sealing material 310 and the display substrate 110 may be formed of the same material, an interface bonding force between the sealing material 310 and the display substrate 110 may be enhanced. Also, the sealing material 310 contacts side walls of the through holes 3605, covers the partition walls 3615, and directly contacts and is adhered to side surfaces and upper portions of the partition walls 3615. Thus, the bonding force between the sealing material 310 and the display substrate 110 may be enhanced through a stereoscopic coupling between the sealing material 310 and the bonding layer 390.

Figure 2C:
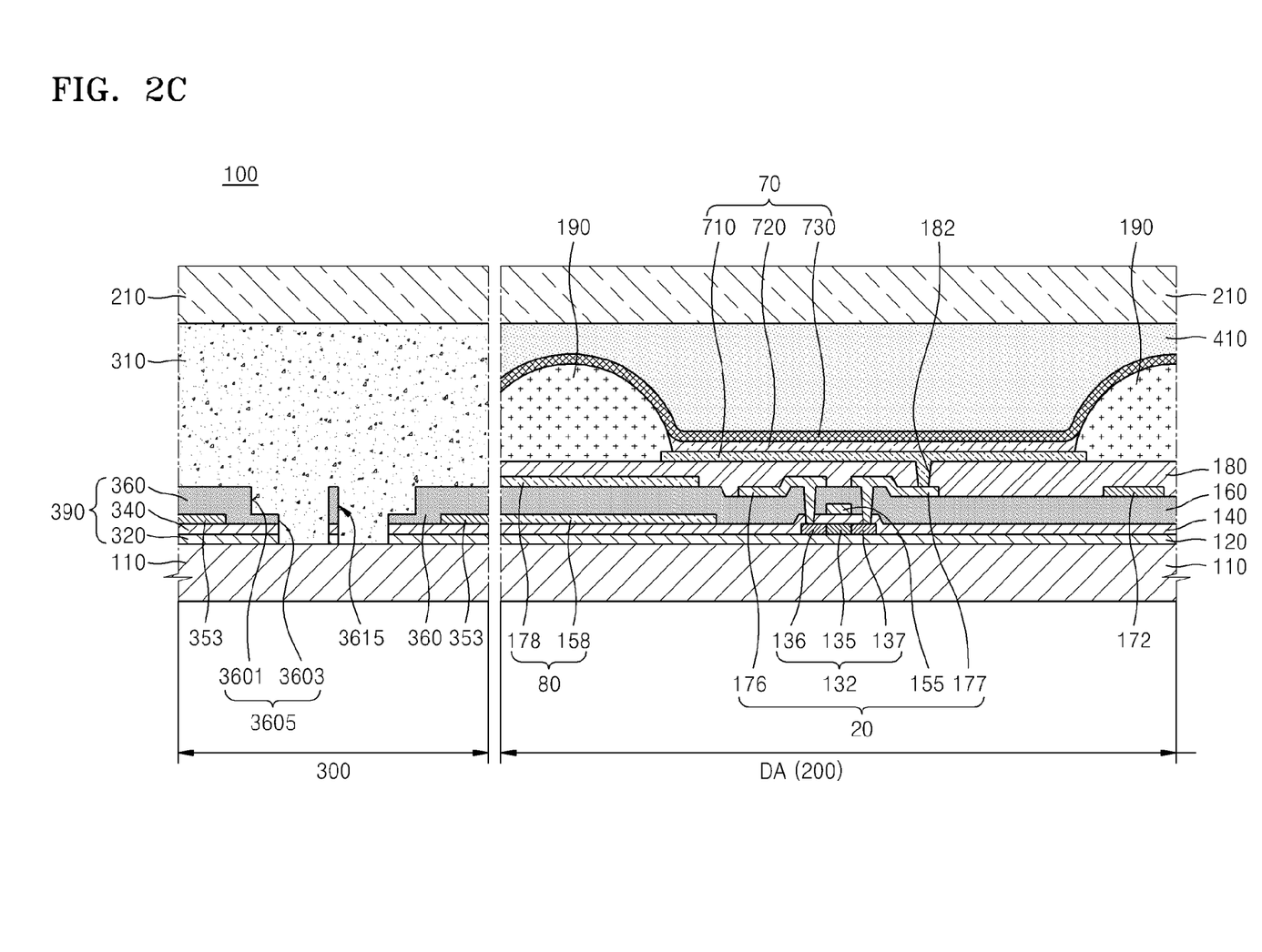
FIG. 2C is a cross-sectional view of an organic light-emitting display apparatus including a sealing unit, according to another embodiment of the present disclosure.

FIG. 2C is a cross-sectional view of the organic light-emitting display apparatus 100 including the sealing unit 300, according to another embodiment of the present disclosure. In FIG. 2C, like reference numerals as shown in FIG. 2A denote like elements, and thus their description will not be provided here.

Referring to FIG. 2C, the through holes 3605 of the bonding layer 390 include first through holes 3601 and second through holes 3603. The first through holes 3601 and second through holes 3603 have different sizes so that side walls of the through holes 3605 are formed in stairs shapes. Although the side walls of the through holes 3605 are formed in monolayer stairs shapes in FIG. 2C, the side walls may be formed in multilayer stairs shapes. In some embodiments, a half-tone mask may be used to form the first through holes 3601 and the second through holes 3603. In some embodiments, the partition walls 3615 may be formed as monolayer insulation layers or multilayer insulation layers.

In some embodiments, the sealing material 310 directly contacts an upper portion of the third insulation layer 360 and an upper portion of the display substrate 110 through the through holes 3605 of the bonding layer 390. In a case where the sealing material 310 and the display substrate 110 may be formed of the same material, an interface bonding force between the sealing material 310 and the display substrate 110 may be enhanced. Also, the sealing material 310 contacts side walls of the first through holes 3601 and the second through holes 3603, covers the partition walls 3615, and directly contacts and is adhered to side surfaces and upper portions of the partition walls 3615. Thus, the bonding force between the sealing material 310 and the display substrate 110 may be enhanced through a stereoscopic coupling between the sealing material 310 and the bonding layer 390.

Figure 3A:
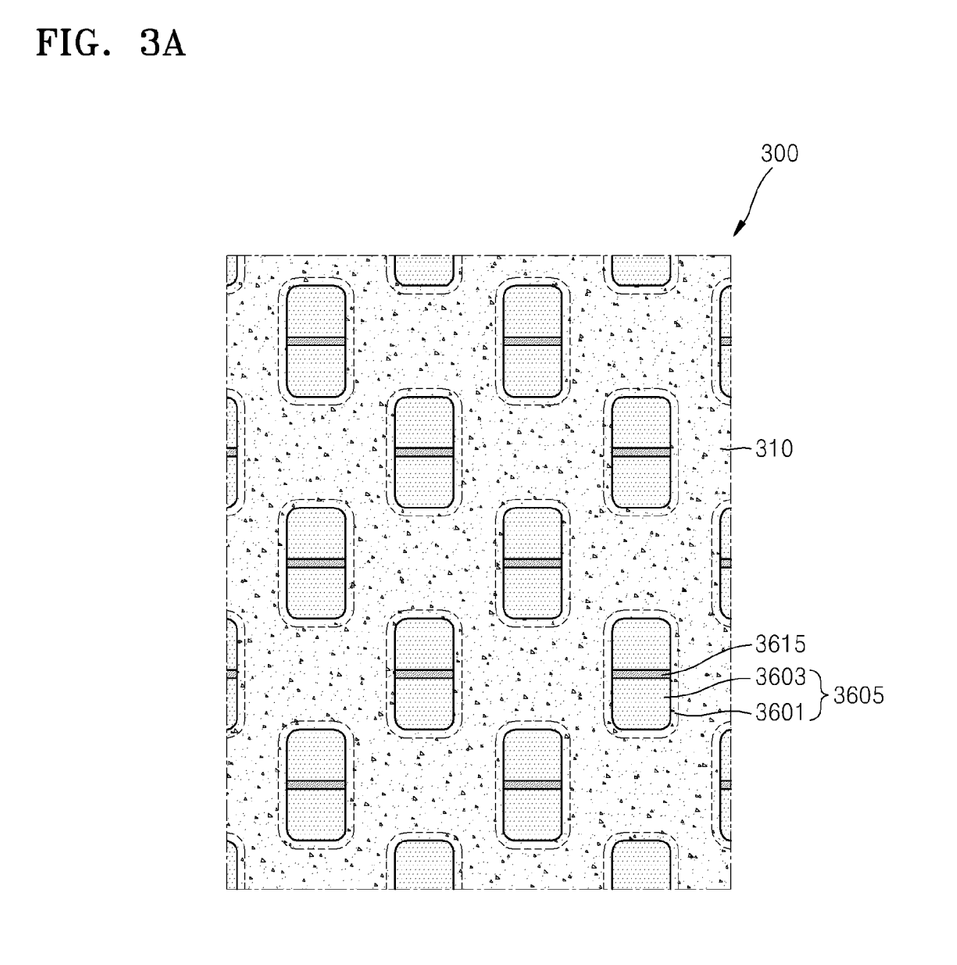
FIGS. 3A through 3C are plan views of a sealing unit, according to embodiments of the present disclosure.
Figure 3B:
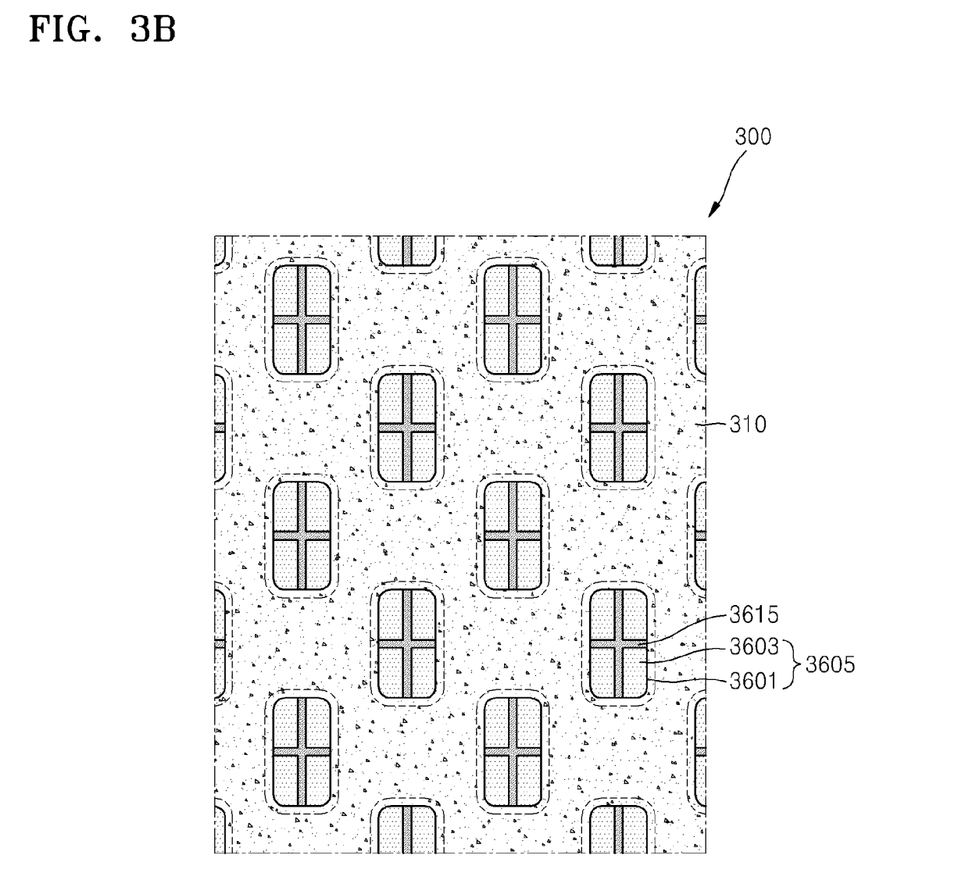
Figure 3C:
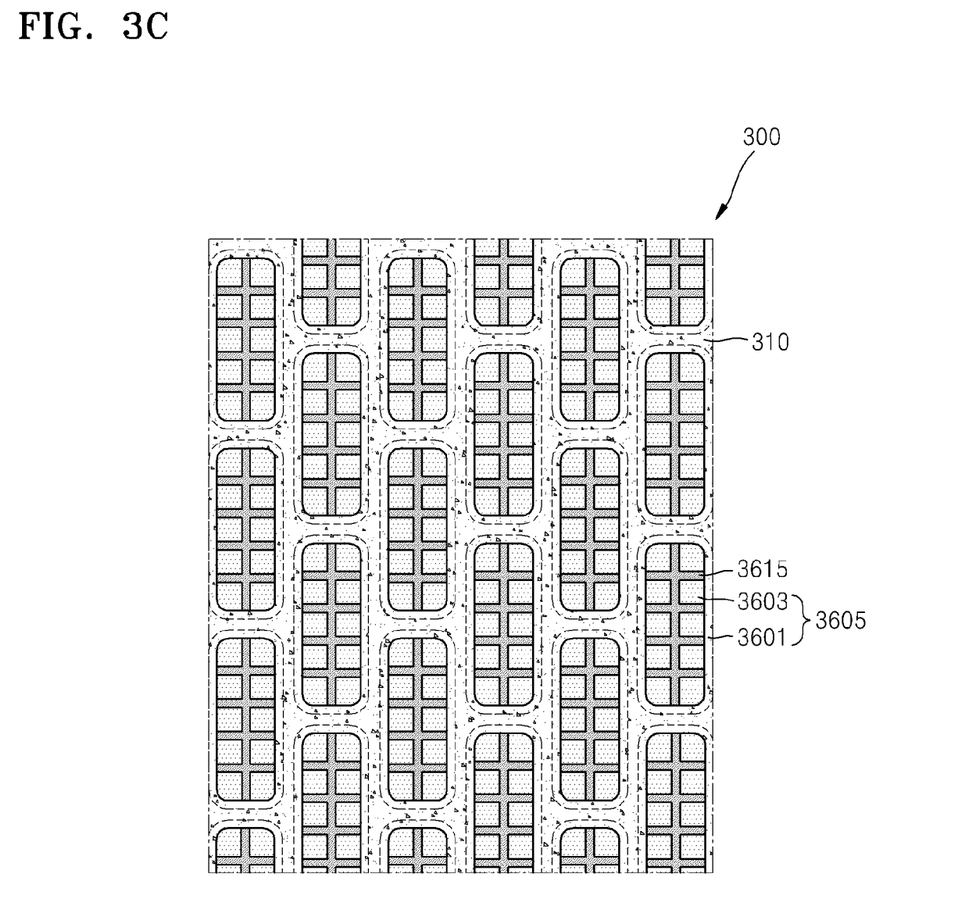

FIGS. 3A through 3C are plan views of the sealing unit 300, according to embodiments of the present disclosure. Referring to FIG. 3A, a single partition wall 3615 may be formed in an inner center of each of the through holes 3605. Referring to FIGS. 3A and 3B, a plurality of partition walls 3615 may be formed in the through holes 3605 to cross each other. In some embodiments, the larger the number of the partition walls 3615 formed in the through holes 3605, the greater the bonding area between the sealing material 310 and the bonding layer 390, and thus a bonding force therebetween may increase.

Figure 4A:
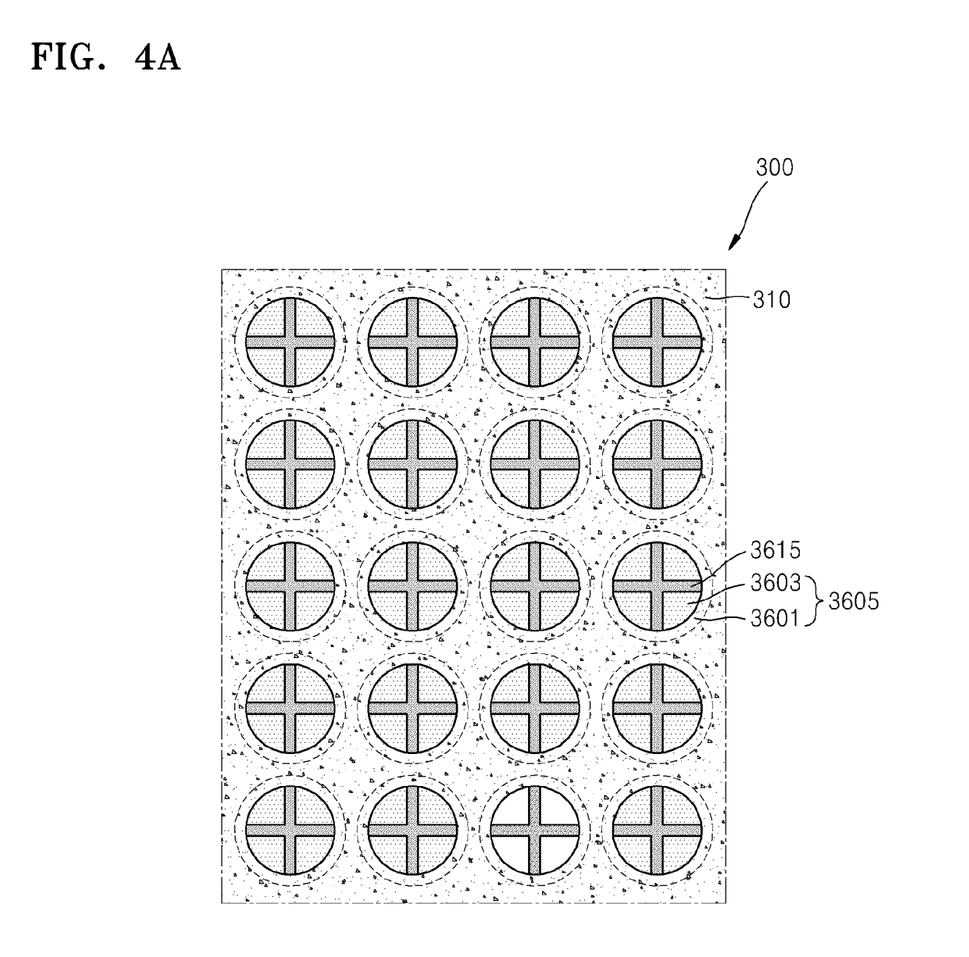
FIGS. 4A and 4B are plan views of a sealing unit, according to other embodiments of the present disclosure.
Figure 4B:
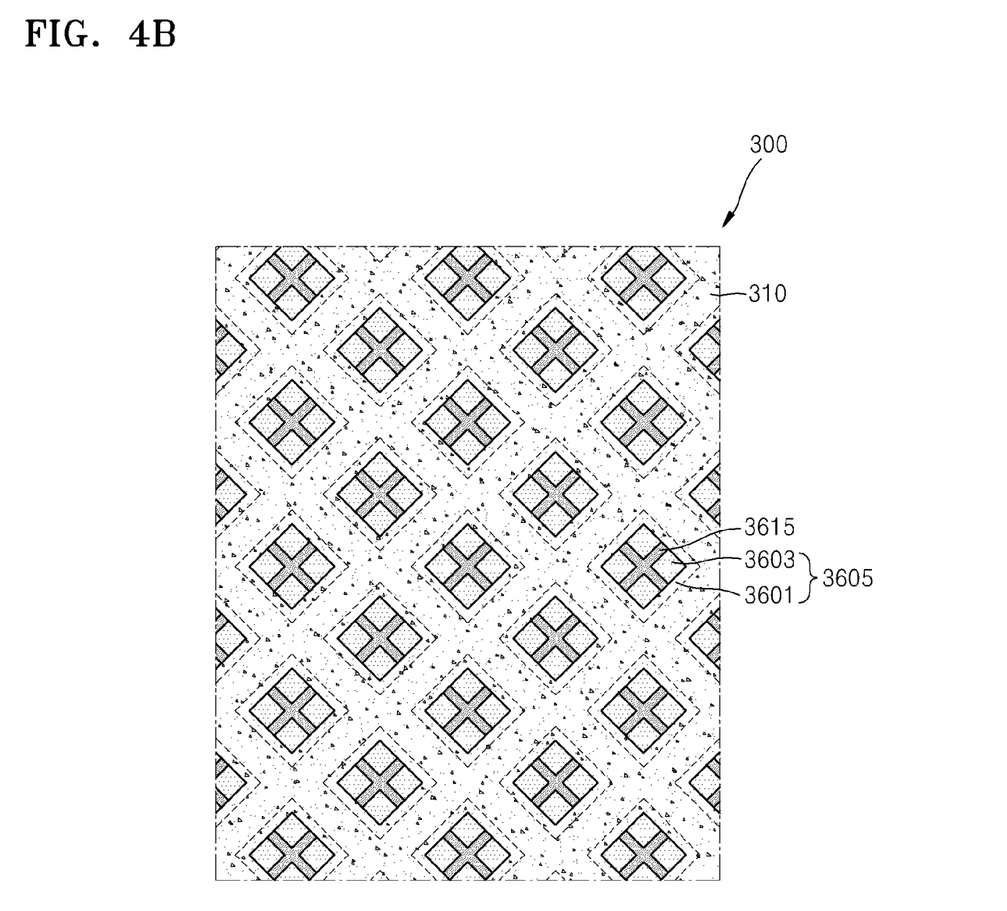

FIGS. 4A and 4B are plan views of the sealing unit 300, according to other embodiments of the present disclosure. In some embodiments, the through hole 3605 of the bonding layer 390 may have various shapes. In some embodiments, the through hole 3605 of the bonding layer 390 may have rectangular shapes as shown in FIG. 3A, and circular shapes as shown in FIG. 4A. Also, as shown in FIG. 4B, the through holes 3605 may have diamond shape. The shapes of the through holes 3605 are not limited thereto, and may be modified in various ways.

The above-described organic light-emitting display apparatus employs a sealing unit capable of stereoscopic coupling of a sealing material and a display substrate, thereby enhancing a bonding intensity between the display substrate and a sealing substrate and preventing an exfoliation phenomenon due to an external shock.

Further, the sealing unit of the above-described organic light-emitting display apparatus employs a light absorption layer, thereby increasing hardening efficiency of the sealing material by using laser.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. An organic light-emitting display apparatus, comprising:
   a display substrate;
   a sealing substrate configured to face the display substrate;
   a display unit located between the display substrate and sealing substrate, wherein said display unit comprises an organic light-emitting diode (OLED) and a thin-film transistor (TFT);
   a sealing material for bonding the display substrate and the sealing substrate and surrounding a circumference of the display unit; and
   a bonding layer comprising a plurality of through holes disposed in a region corresponding to a circumference of the display unit and configured to allow contact between the sealing material and the display substrate, and a partition wall disposed in each of the through holes, an end portion of the partition wall in contact with a sidewall of each of the through holes such that each of the plurality of through holes is divided into a plurality of sub-through holes, wherein a first distance between neighboring through holes is greater than a second distance between neighboring sub-through holes of each through hole, wherein each of the through holes has a first width and the partition wall has a second width, and the second width is smaller than the first width.

2. The organic light-emitting display apparatus of claim 1, wherein the bonding layer comprises a light absorption layer.

3. The organic light-emitting display apparatus of claim 2, wherein the light absorption layer comprises a conductive material.

4. The organic light-emitting display apparatus of claim 1, wherein the sealing material is frit.

5. An organic light-emitting display apparatus, comprising:
 a display substrate;
 a sealing substrate configured to face the display substrate;
 a display unit located between the display substrate and sealing substrate, wherein said display unit comprises an organic light-emitting diode (OLED) and a thin-film transistor (TFT);
 a sealing material for bonding the display substrate and the sealing substrate and surrounding a circumference of the display unit; and
 a bonding layer comprising a plurality of through holes configured to allow contact between the sealing material and the display substrate, and a partition wall disposed in each of the through holes, an end portion of the partition wall in contact with a sidewall of each of the through holes,
 wherein each of the through holes has a first width and the partition wall has a second width, and the second width is smaller than the first width, and
 wherein a plurality of the partition walls are included in the plurality of through holes and two or more of the plurality of the partition walls are formed to cross each other on a plane substantially parallel to the sealing substrate.

6. The organic light-emitting display apparatus of claim 1, wherein a size of a width of each of the partition walls is from 5% to 20% of a size of each of the plurality of through holes.

7. The organic light-emitting display apparatus of claim 1, wherein side walls of the plurality of through holes are stair shaped.

8. The organic light-emitting display apparatus of claim 1, wherein side walls of the plurality of through holes are formed of insulation materials.

9. The organic light-emitting display apparatus of claim 1, further comprising an auxiliary layer, wherein the auxiliary layer and the TFT are sequentially stacked on the display substrate,
 wherein the TFT comprises an active layer, a gate insulating layer covering the active layer, a gate electrode insulted from the active layer by the gate insulating layer, an interlayer insulating layer covering the gate electrode, and a source electrode and a drain electrode that are formed on the interlayer insulating layer and contact the active layer, and
 wherein the bonding layer comprises a layer in which the interlayer insulating layer extends.

10. The organic light-emitting display apparatus of claim 9, wherein the bonding layer has a structure in which a first insulation layer, a second insulation layer, and a third insulation layer are sequentially stacked, and
 wherein the first insulation layer, the second insulation layer, and the third insulation layer are formed of the same materials of the auxiliary layer, the gate insulating layer, and the interlayer insulating layer, respectively.

11. The organic light-emitting display apparatus of claim 9, wherein the bonding layer comprises a light absorption layer,
 wherein the light absorption layer is formed of the same material as the gate electrode.

12. An organic light-emitting display apparatus comprising a display unit and a sealing unit surrounding the display unit, wherein the sealing unit comprises:
 a display substrate;
 a bonding layer;
 through holes disposed in a region corresponding to a circumference of the display unit and comprising a partition wall therein, end portion of the partition wall is in contact with side wall of each of the through holes such that each of the through holes is divided into a plurality of sub-through holes, wherein a first distance between neighboring through holes is greater than a second distance between neighboring sub-through holes of each through hole; and
 a sealing material bonded to the display substrate through the through holes, wherein said bonding layer comprises a first insulation layer formed on the display substrate, a light absorption layer formed on the first insulation layer and formed of a conductive material, a second insulation layer covering the light absorption layer,
 wherein each of the through holes has a first width and the partition wall has a second width, and the second width is smaller than the first width.

13. The organic light-emitting display apparatus of claim 12, wherein the partition walls are formed of insulating materials.

14. The organic light-emitting display apparatus of claim 12, wherein the through holes have rectangular shapes, and
 wherein a plurality of the partition walls are included in the through holes and cross each other.

15. The organic light-emitting display apparatus of claim 12, wherein the display substrate and the sealing material are formed of the same material.

* * * * *